United States Patent
Saxena et al.

(10) Patent No.: US 10,852,337 B2
(45) Date of Patent: Dec. 1, 2020

(54) TEST STRUCTURES FOR MEASURING SILICON THICKNESS IN FULLY DEPLETED SILICON-ON-INSULATOR TECHNOLOGIES

(71) Applicant: PDF Solutions, Inc., San Jose, CA (US)

(72) Inventors: Sharad Saxena, Richardson, TX (US); Tomasz Brozek, Morgan Hill, CA (US); Yuan Yu, San Jose, CA (US); Mike Kyu Hyon Pak, San Jose, CA (US); Meindert Martin Lunenborg, St Gely du Fesc (FR)

(73) Assignee: PDF Solutions, Inc., San Jose, CA (US)

( * ) Notice: Subject to any disclaimer, the term of this patent is extended or adjusted under 35 U.S.C. 154(b) by 68 days.

(21) Appl. No.: 15/611,576

(22) Filed: Jun. 1, 2017

(65) Prior Publication Data
US 2017/0309524 A1    Oct. 26, 2017

Related U.S. Application Data

(62) Division of application No. 14/839,674, filed on Aug. 28, 2015, now Pat. No. 9,691,669.

(51) Int. Cl.
*G01B 7/06* (2006.01)
*G01R 27/26* (2006.01)
*H01L 21/66* (2006.01)

(52) U.S. Cl.
CPC .......... *G01R 27/2605* (2013.01); *G01B 7/08* (2013.01); *H01L 22/14* (2013.01); *H01L 22/34* (2013.01); *G01B 2210/56* (2013.01)

(58) Field of Classification Search
CPC ........... H01L 22/14; H01L 22/34; G01B 7/08; G01B 2210/56; G01R 27/2605
See application file for complete search history.

(56) References Cited

U.S. PATENT DOCUMENTS

| | | | |
|---|---|---|---|
| 6,456,105 B1 | 9/2002 | Tao | |
| 7,075,318 B1 | 7/2006 | Zhang et al. | |
| 9,882,005 B2* | 1/2018 | Cheng | H01L 29/1037 |
| 2003/0122199 A1 | 7/2003 | Koyama et al. | |
| 2006/0128074 A1* | 6/2006 | Tigelaar | H01L 21/84 438/149 |
| 2008/0265867 A1 | 10/2008 | Gaynes | |
| 2012/0112280 A1* | 5/2012 | Johnson | H01L 21/76237 257/347 |
| 2015/0270399 A1* | 9/2015 | Zhu | H01L 21/26506 257/347 |

* cited by examiner

*Primary Examiner* — Jeff W Natalini
(74) *Attorney, Agent, or Firm* — Pillsbury Winthrop Shaw Pittman LLP

(57) ABSTRACT

Described are test structures and methods for measuring silicon thickness in fully depleted silicon-on-insulator technologies.

8 Claims, 10 Drawing Sheets

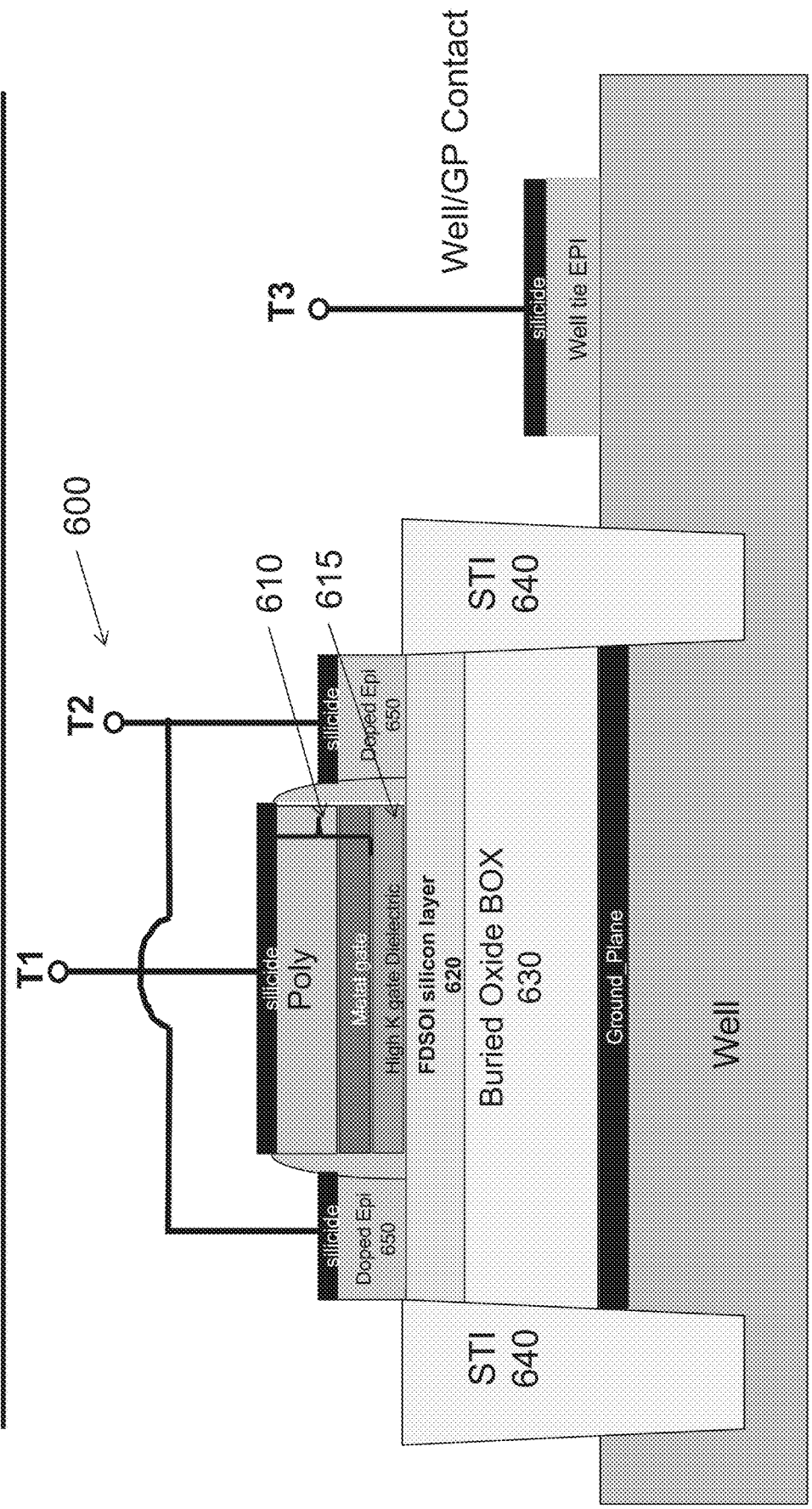

TEST STRUCTURES FOR MEASURING SILICON THICKNESS IN FULLY DEPLETED SILICON-ON-INSULATOR TECHNOLOGIES

CROSS-REFERENCE TO RELATED APPLICATIONS

This application is a Divisional of U.S. patent application Ser. No. 14/839,674, filed Aug. 28, 2015, the contents of which are incorporated herein by reference in their entirety.

FIELD OF THE ART

Described are test structures and methods for measuring silicon thickness in fully depleted silicon-on-insulator technologies.

BACKGROUND

Fully depleted silicon-on-insulator (FDSOI) is a CMOS technology with many attractive features. Primary among these are low off-state current due to better electrostatics and also the capability for low-power operation due to low local-variation and mismatch in FDSOI technologies.

Conventional methods of determining a FDSOI thickness are, generally, optical methods using ellipsometry and measurement of transistor characteristics.

Methods based upon optics have very low throughput and allow only a small sample of sites on a wafer to be measured in a reasonable time.

Methods based on measuring transistor characteristics such as line threshold voltage (Vth) and having a separate model which maps Tsi to Vth exist, with the difficulty being that an electrical parameter like Vth is sensitive to many factors like gate length, width, gate dielectric thickness, work-function etc. Extracting Tsi from a Vth measurement requires separating the impact of each of these factors, which is very difficult in practice.

SUMMARY

Described are test structures for measuring silicon thickness in fully depleted silicon-on-insulator technologies.

In one aspect, an apparatus for determining a thickness of a fully depleted silicon-on-insulator layer disposed in a CMOS integrated circuit, the apparatus being disposed on a FDSOI substrate that also includes the CMOS integrated circuit, the apparatus comprising: a test structure that includes at least one test circuit, the at least one test circuit including an isolated fully depleted silicon-on-insulator layer disposed above an isolated buried oxide layer and a gate dielectric disposed above the isolated fully depleted silicon-on-insulator layer and which further includes an Epi region surrounding the isolated fully depleted silicon-on-insulator layer to bias the isolated fully depleted silicon-on-insulator layer, the at least one test circuit providing: a total capacitance measurement; a gate dielectric capacitance measurement; and a buried oxide capacitance measurement.

In a preferred aspect of this apparatus, the at least one test circuit includes a plurality of test circuits, wherein each of the plurality of test circuits include the isolated fully depleted silicon-on-insulator layer disposed above the isolated buried oxide layer, wherein a desired thickness of the isolated fully depleted silicon-on-insulator layer and a desired thickness of the isolated buried oxide layer on the plurality of test circuits is representative of, respectively, a thickness of the isolated fully depleted silicon-on-insulator layer and a thickness of the isolated buried oxide layer on the CMOS integrated circuit, the test structure further including: a total capacitance measurement circuit as one of the plurality of test circuits and that provides a total capacitance measurement and includes a gate dielectric disposed above the isolated fully depleted silicon-on-insulator layer; a gate dielectric capacitance measurement circuit as another of the plurality of test circuits and that provides a gate dielectric capacitance measurement and includes a gate dielectric disposed above the isolated fully depleted silicon-on-insulator layer and which further includes an Epi region surrounding the isolated fully depleted silicon-on-insulator layer to bias the isolated fully depleted silicon-on-insulator layer in an inversion state; and a buried oxide capacitance measurement circuit as a further one of the plurality of test circuits that provides a buried oxide capacitance measurement.

BRIEF DESCRIPTION OF THE DRAWINGS

These and other aspects and features will become apparent to those of ordinary skill in the art upon review of the following description of specific embodiments in conjunction with the accompanying figures, wherein.

DETAILED DESCRIPTION OF THE PREFERRED EMBODIMENTS

Figure 1:
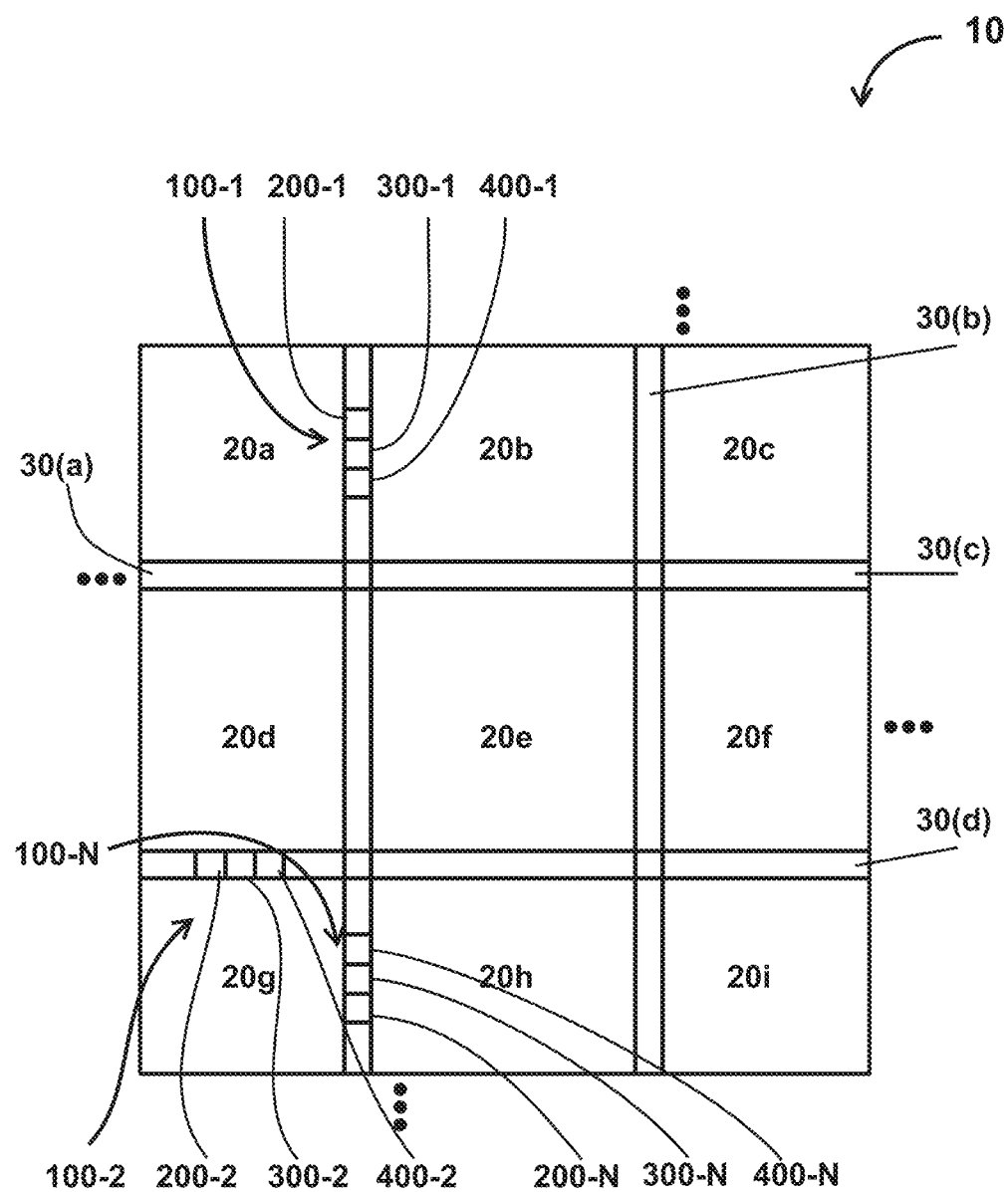
FIG. 1 illustrates a portion of a wafer or die in which the test structures described herein are positions.

As mentioned above, fully depleted silicon-on-insulator (FDSOI) is a CMOS technology with many attractive features. In a conventional processing, a FDSOI layer exists over an insulator that is disposed over a ground plane, over an entire wafer, such that the FDSOI layer is intended as having a consistent thickness over the entire wafer, and thus the dies on the wafer. Such a FDSOI substrate is typically supplied by a wafer vendor to a manufacturing fab. While processing techniques allow for substantial uniformity in the thickness of a FDSOI layer, variations can still occur.

It has been determined that characterization of the variation in the thickness of a FDSOI layer can assist in a number of manners. Such characterization can be used to provide feedback to the fab in order to allow it to change processing parameters and thereby reduce variation in subsequently processes batches, as well as to provide to suppliers of FDSOI substrates that include the FDSOI layer. Also, for a batch of wafers that have been processed, knowing the variability in the thickness of a FDSOI layer can assist in determining how well circuits will perform based on the FDSOI thickness, and consistency of that thickness throughout a given die.

As such, variability in the thickness of the fully depleted silicon layer (Tsi) is a critical parameter for FDSOI technologies; poor control of Tsi can result in loss of the benefits of FDSOI. Described are embodiments for the accurate and efficient monitoring of Tsi in FDSOI technologies, and in particular embodiments based upon a determination of silicon thickness using electrical measurements, which allows for the fast determination of of Tsi in a given die or wafer.

Before providing details on the specific test circuits used in the test structure, it is noted that these test structures are implemented as circuits and fabricated conventionally, along with other integrated circuits disposed on a die or wafer. As such, it is assumed that the Tsi of the integrated circuit in the area of the test structures is representative of that of the Tsi as determined by the test structures. In certain embodiments, however, as described below, variations in Tsi within a die or wafer are also accommodated by using sets of test structures, as described herein.

Further, given that the embodiments described herein are based upon a determination of silicon thickness using electrical measurements, it is noted that within the context of the test circuits described, which are essentially a CMOS transistor structure or parts thereof that are consistent with a CMOS transistor structure, as noted hereinafter, that the following equation applies with respect to a total stack capacitance of such a structure:

$$\frac{1}{C_{si}} = \frac{1}{C_{tot.}} - \frac{1}{C_{box}} - \frac{1}{C_{HK}} \quad \text{(Eq. 1)}$$

Where $C_{si}$ is the capacitance of the isolated fully depleted silicon layer that is within the test circuit, $C_{tot}$ is the total capacitance of the isolated test circuit, $C_{box}$ is the capacitance of the isolated buried oxide layer that is within the test circuit, and $C_{HK}$ is the capacitance of the gate dielectric that is within the test circuit.

It is also noted that each of the test circuits are made in such a manner that they are preferably identical in area dimensions, so that measurements achieved are not skewed by differences in area that exist, so that the thickness of the isolated fully depleted silicon layer is determined with the greatest accuracy. Of course different ratioed dimensions could be used, such that one of the test circuits has an area that is 2× that of another one of the test circuits, and such area differences can then be accommodated. As such, since the structure geometry and dielectric property of silicon are well-known, this allows the Tsi determination based upon capacitance measurement and calculation of other parameters such as gate-dielectric and buried oxide thickness as discussed herein.

Further, it is noted that an enabling technology for these embodiments is the ability to measure capacitance with leakage. The method outlined in PDF NID # 20150415 is one technique that allows the method described herein to be applied, and which is expressly incorporated by reference herein.

The method that determines Tsi obtains the measurements used in such determination using a test structure set 100 of three test circuits, 200, 300, and 400 as shown in FIG. 1 and further described below. As shown in FIG. 1, a number of different sets 100 of the test circuits can be located on a single FDSOI substrate 10, with sets 100-1, 1-2 and 100-N being shown in disparate locations, with the integrated circuit formed on the single FDSOI subtstrate 10 being shown for illustrative purposes as integrated circuits 20a-i, bounded by scribe lanes 30(a-d), though of course there will typically be many more integrated circuits 20 and scribe lanes 30 on a single wafer.

Each of the test structure sets 100-1, 100-2, 100-N, as shown, preferably include the three test circuits 200, 300, and 400, and within each set, the three test circuits are each disposed preferably adjacent to, but in any event in close proximity to, each other, typically in a scribe lane 30 between dies. Each of the test structures 100-1, 100-2, 100-N as described are described in the illustrated embodiment below as fabricated on an N+ substrate, though these test circuits can also be used for a P+ substrate, as is well-known using conventional techniques in conjunction with the N+ substrate embodiments described herein.

The test circuit 200, as shown in FIG. 2(a-b), measures the total capacitance of the gate-dielectric (high-K or oxide) 215, also referred to herein as gate dielectric, plus the fully depleted silicon layer 220 and the insulating buried oxide 230. It is noted that the total capacitance of obtained as the sum of the Csi, CHK, and Cbox capacitances in series.

Figure 2A:
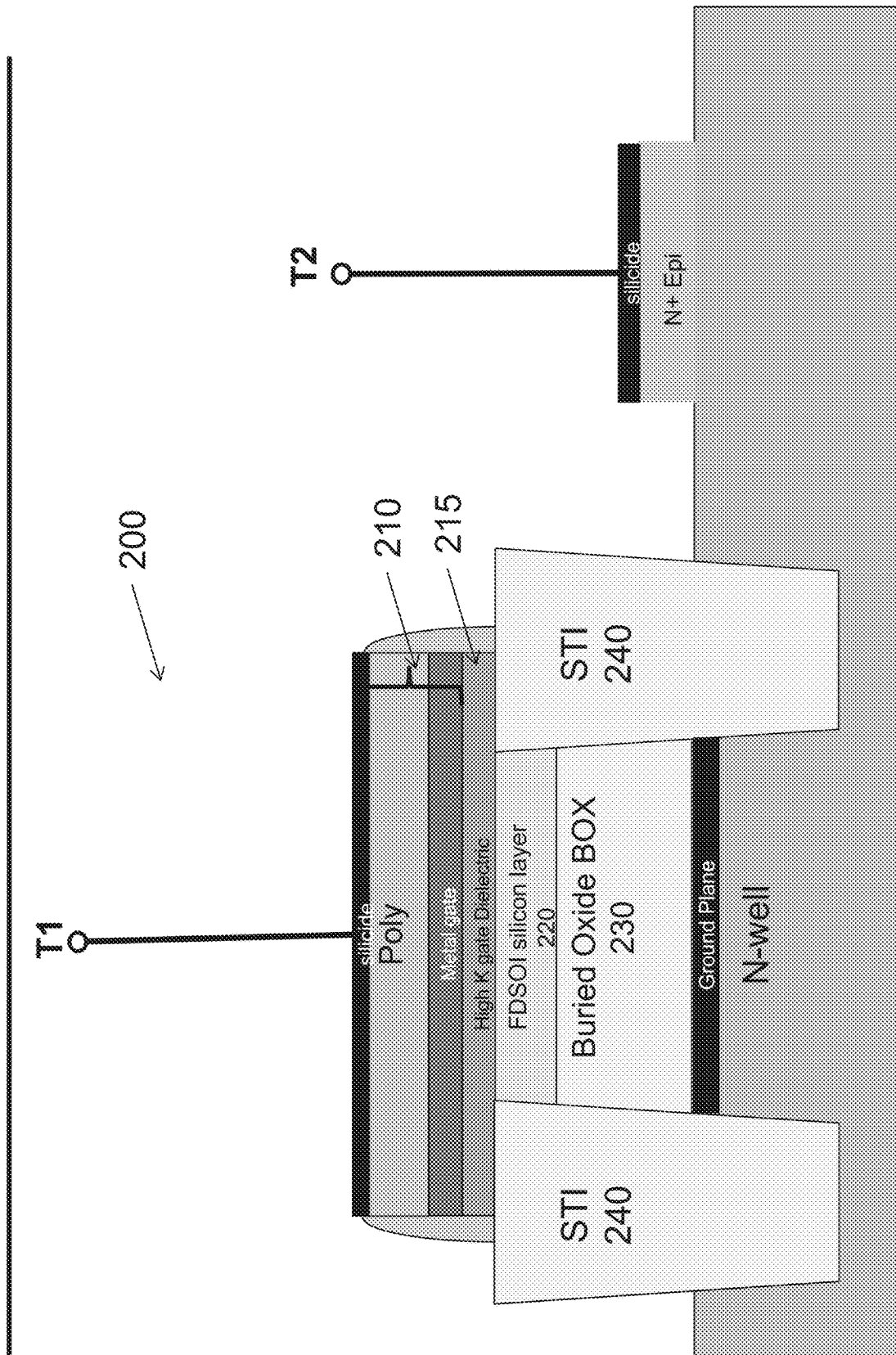
FIGS. 2(a-b) illustrate a test circuit for measuring total capacitance according to an embodiment.

FIG. 2a shows the cross section, in which the isolated FDSOI layer 220 is disposed between the buried oxide layer 230 and the gate dielectric 215, and the gate dielectric 215 is disposed between the top gate 210 and the FDSOI layer 220. Shallow Trench Isolation (STI) 240 is used to isolate the test circuit 200. From the top gate 210 is disposed a Terminal 1. Outside of the isolated area is a Terminal 2, which is connected to the n-well through an N+ EPI and silicide stack, though other connections can be used.

Figure 2B:
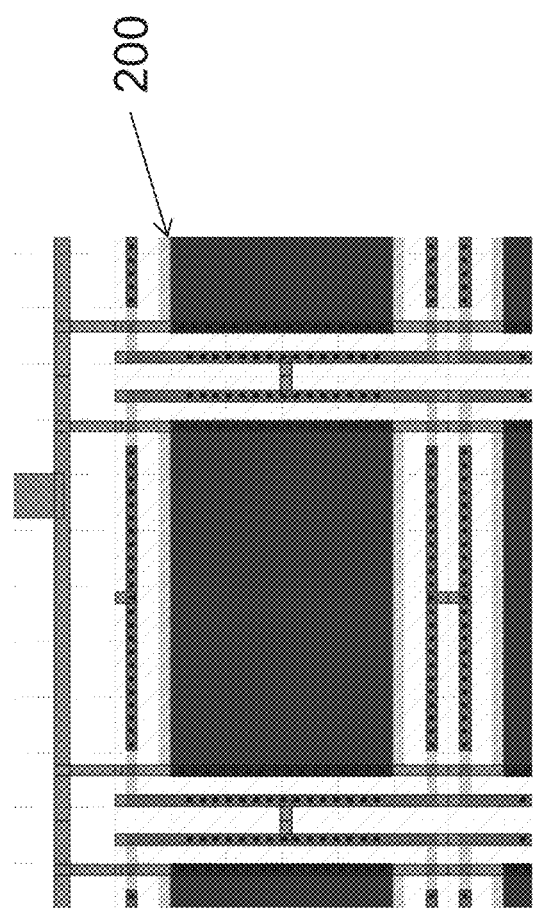

FIG. 2b illustrates a top view of the test circuit 200, and in particular a top view of all of the areas of the test circuit that are above and below the isolated FDSOI layer 220.

Figure 3A:
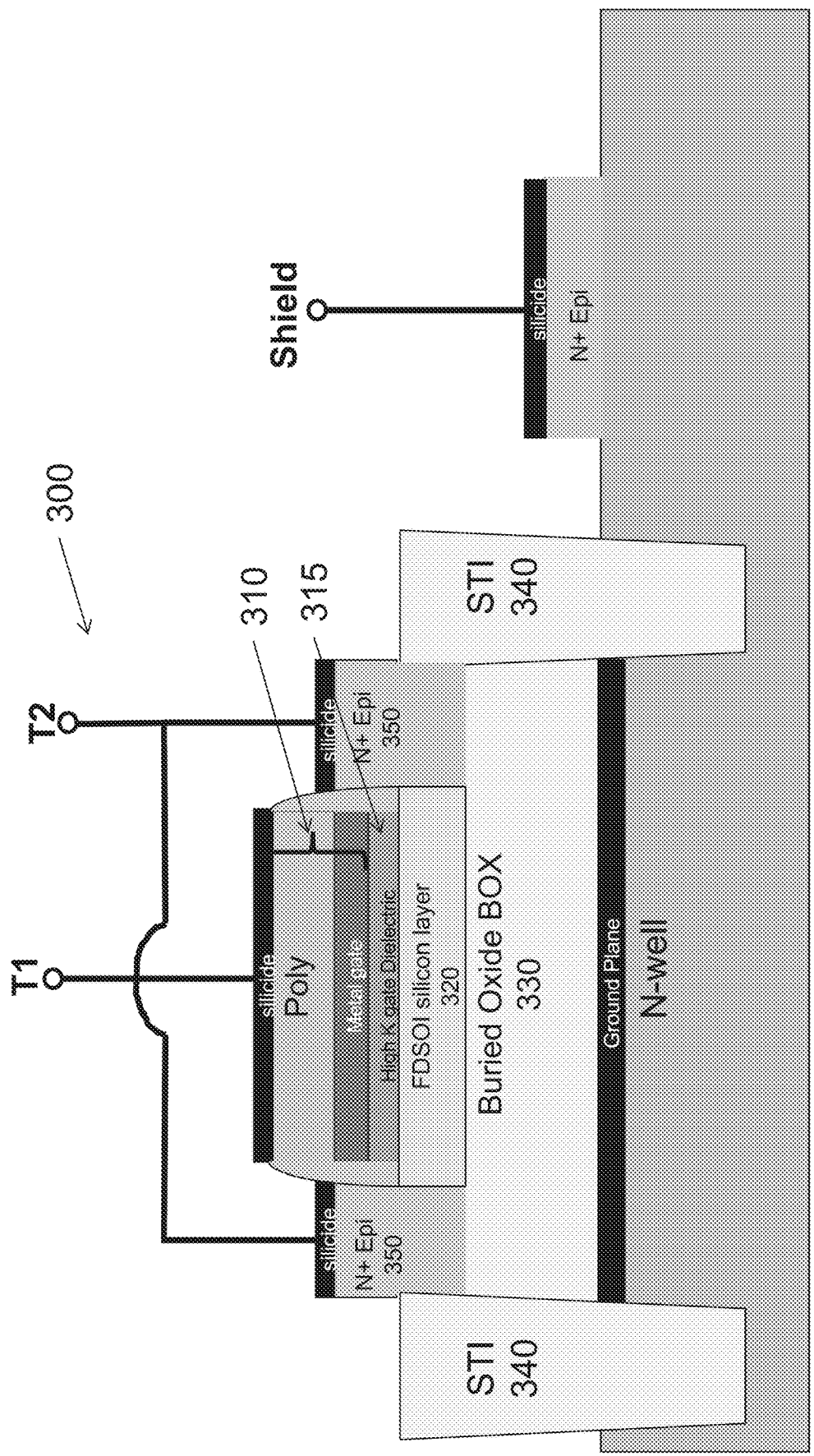
FIGS. 3(a-b) illustrate a test circuit for measuring gate dielectric capacitance according to an embodiment.

The test circuit 300, as shown in FIG. 3(a-b), measures the capacitance of only the gate dielectric 315. In this test circuit 300, the isolated FDSOI layer 320 is disposed between the buried oxide layer 330 and the gate dielectric 315, and the gate dielectric 315 is disposed between the top gate 310 and the FDSOI layer 320. Standard thick isolation (STI) 340 is used to isolate the test circuit 300. From the top gate 310 is disposed a Terminal 1. Source-Drain regions 350 through Terminal 2 supply the charge to FDSOI silicon layer 320 needed for the measurement, CHK in this instance. Further, connecting the Shield Terminal to virtual ground will protect measurement signals from any outside noise source.

Figure 3B:
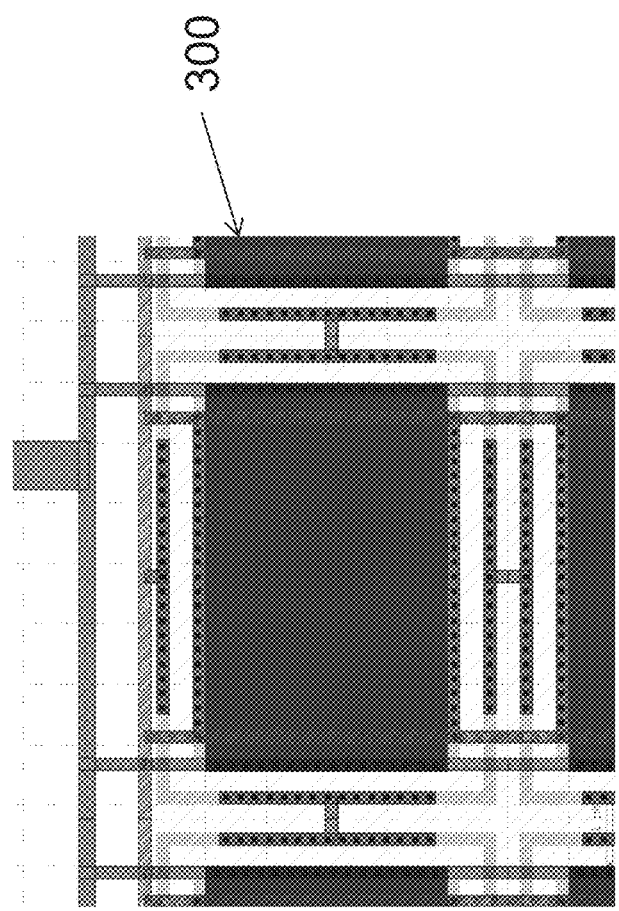

FIG. 3b illustrates a top view of the test circuit 300, and in particular a top view of all of the areas of the test circuit that are above and below the isolated FDSOI layer 320.

Figure 4A:
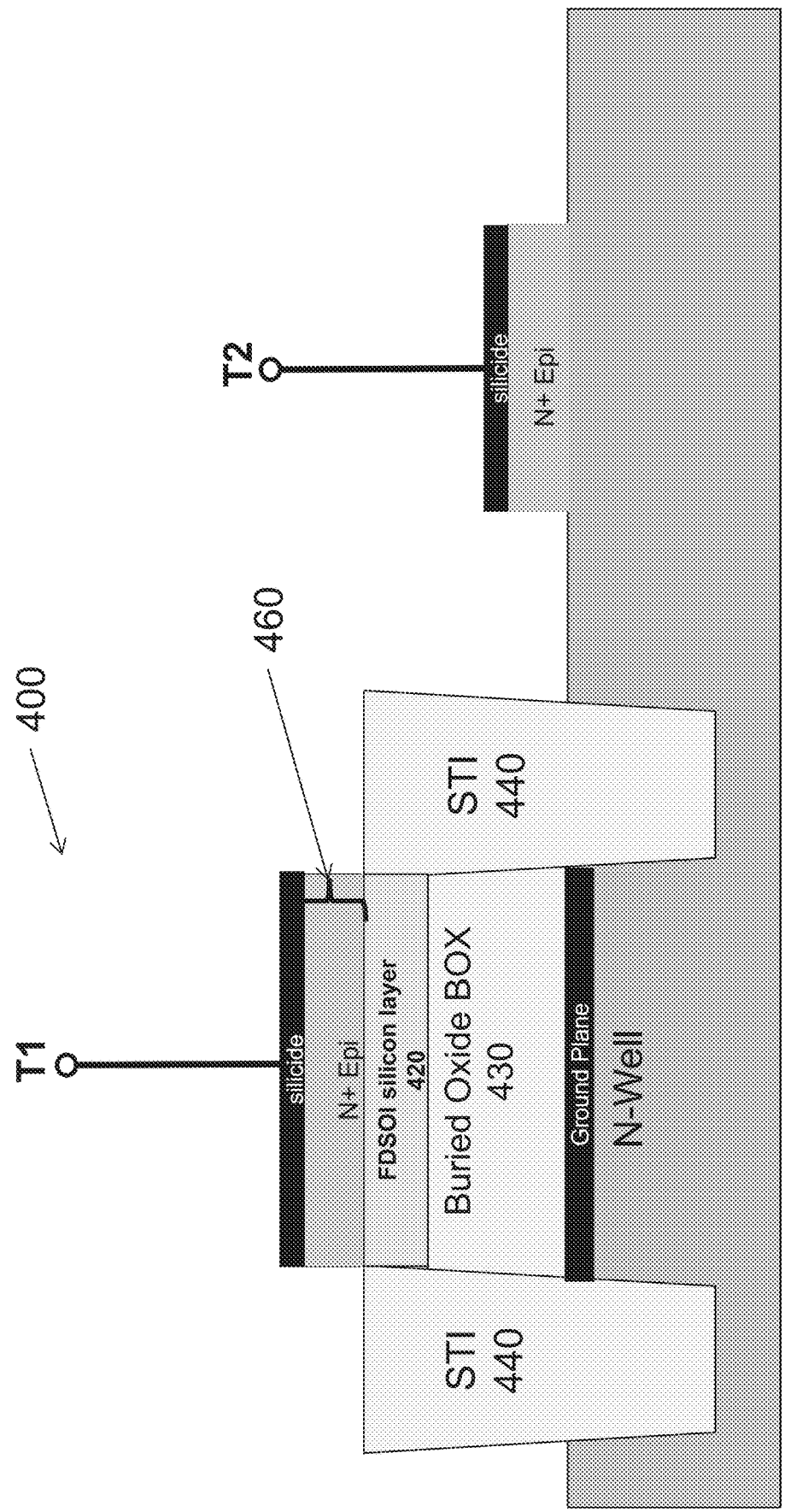
FIGS. 4(a-b) illustrate a test circuit for measuring buried oxide capacitance according to an embodiment.
Figure 4B:
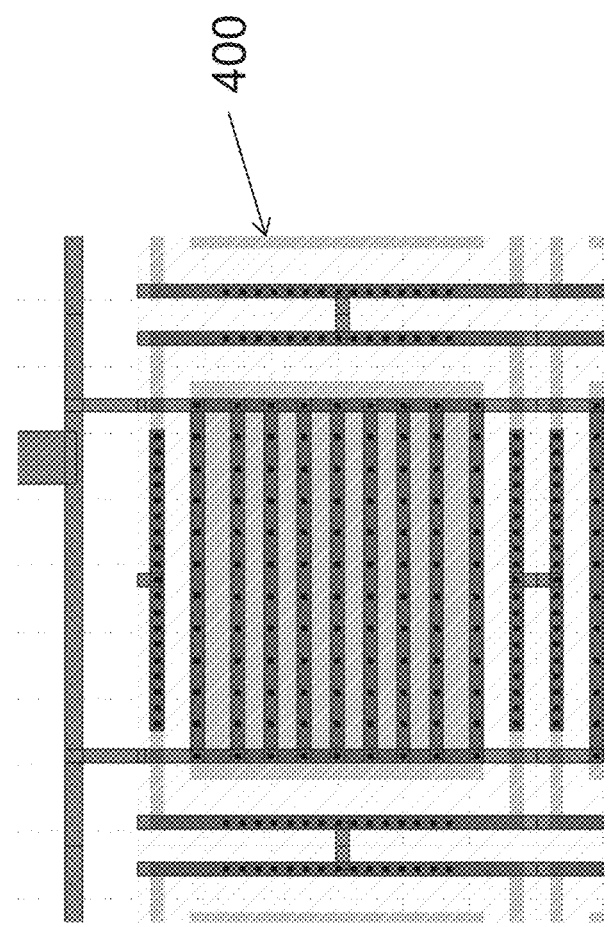

The test circuit 400 as shown in FIG. 4(a-b) measures the capacitance of the buried oxide using a silicon layer 460 disposed over the FDSOI layer 420, with FIG. 4(a) showing a cross-section view and FIG. 4(b) illustrating a top view. In this test circuit 400, the FDSOI layer 420 is between the buried oxide layer 430 and a silicon layer 460. Standard thick isolation (STI) 440 is used to isolate the test circuit 400. From the silicon layer 460 is disposed a Terminal 1. Outside of the isolated area is a Terminal 2, which is connected to the n-well through an N+ EPI and silicide stack, though other connections can be used.

Figure 5:
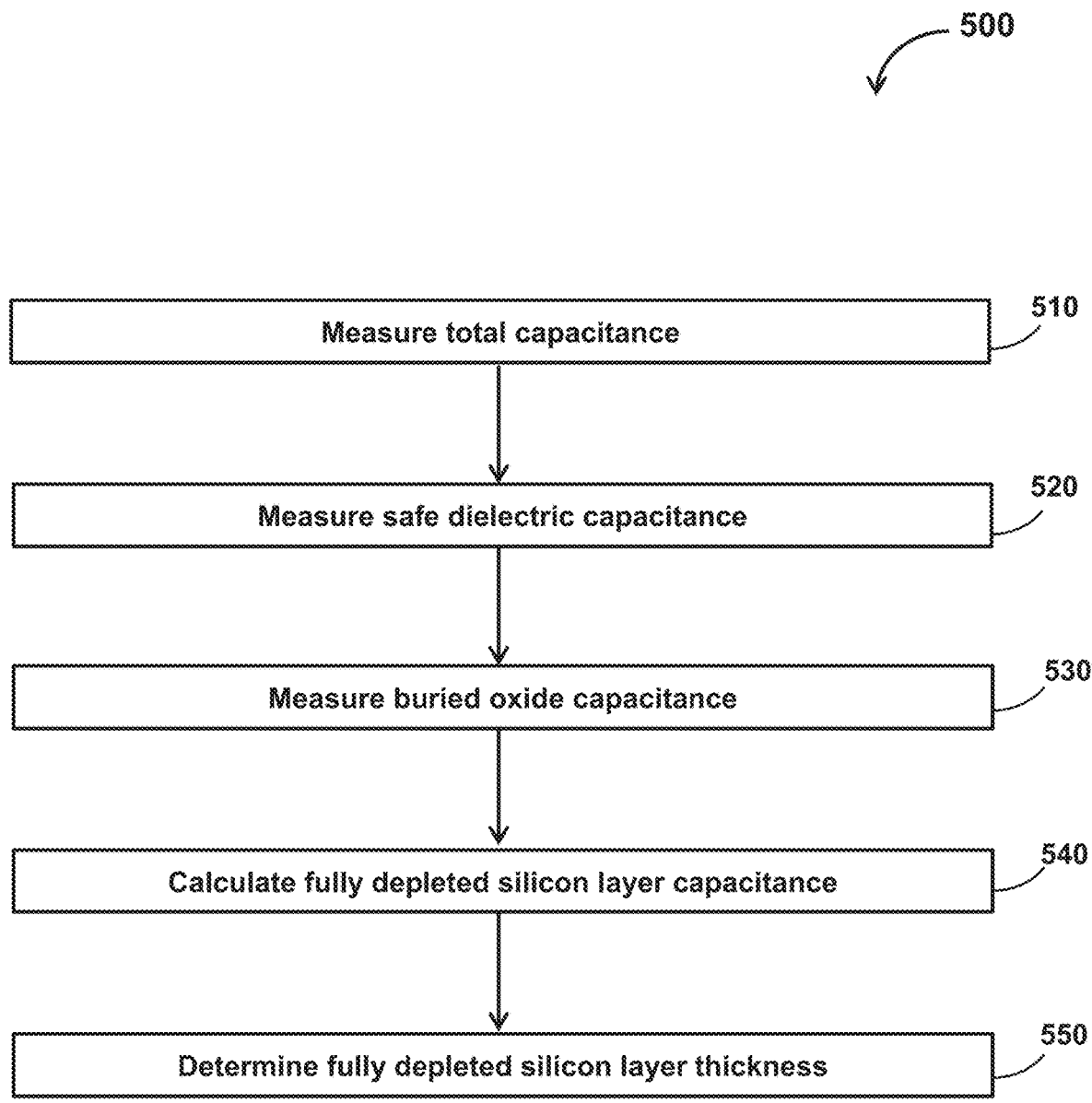
FIG. 5 illustrates a method of determining a thickness of a fully depleted silicon-on-insulator layer disposed in a CMOS integrated circuit according to an embodiment.

FIG. 5 illustrates a flow chart that shows the method of obtaining the FDSOI silicon thickness. Step 510 measures the total capacitance, using a test circuit such as illustrated in FIG. 2. The gate dielectric capacitance is obtained in step 520 using a test circuit such as illustrated in FIG. 3. The buried oxide capacitance is obtained in step 530 using a test circuit such as illustrated in FIG. 4. The obtained gate dielectric capacitance and buried oxide capacitance provide measurements of two of the three components of capacitance that make up the total capacitance. As shown in step 540, by subtracting these two components from the total capacitance, the capacitance of the isolated FDSOI layer is obtained. This FDSOI layer capacitance can be used, as shown in step 550, to determine the FDSOI silicon thickness or can be converted to a thickness number with known geometry of the test structure. While the various steps 510, 520 and 530 are shown as sequential, in an embodiment where multiple test circuits exist as shown in FIG. 1, such measurements can be done in parallel as well.

Figure 6B:
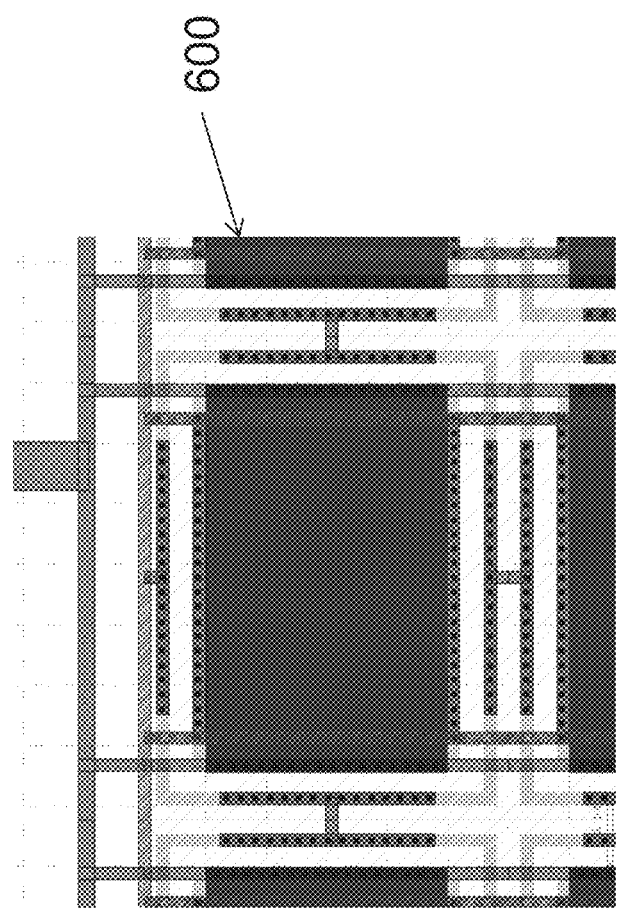
FIGS. 6(a-b) illustrate another embodiment of a test circuit according to an embodiment.

FIGS. 6(*a-b*) illustrate another embodiment of a test circuit according to an embodiment. In this embodiment, a single test circuit 600 can be used to sequentially obtain the various different test measurements that are individually obtained in the above test circuits shown in FIGS. 2, 3 and 4, with the same test circuit being reconfigured for sequential tests, or the same test circuit fabricated multiple times and then connected in a manner to obtain the appropriate measurement, as further described. In this test circuit 600, as shown in FIG. 6(*a*), the isolated FDSOI layer 620 is disposed between the buried oxide layer 630 and the gate dielectric 610. Standard thick isolation (STI) 640 is used to isolate the test circuit 600. From the gate dielectric 610 is disposed a Terminal 1. Source-Drain regions 650 through Terminal 2 supply the charge to FDSOI Silicon layer 620 needed for the measurement, and the Shield Terminal 3, in the instances required, is connected to virtual ground to protect measurement signals from outside noise sources.

FIG. 6(*b*) illustrates a top view of the test circuit 600, and in particular a top view of all of the areas of the test circuit that are above and below the isolated FDSOI layer 620.

The various measurements can be obtained as follows, using this test structure 600:

CHK—Measure from T1 to T2 with T3 as Shield (same measurement configuration as in FIG. 3)

Cbox—Measure T3 to T2 with T1 as Shield. Cbox will be considered as a back gate dielectric, and can be biased in either accumulation or inversion state.

Ctotal—Measure from T1 to T3 while T2 terminal can be either connected to virtual-ground/Shield or left floated. Either technique will ensure the thin silicon layer that is connected to T2 to remain in fully depleted state during this measurement.

It is noted that the floating T2 terminal may introduce additional parasitic capacitance components (eg. Floating Contact to Top Gate coupling parasitic capacitance). Either or both of below measures can be taken to mitigate this effect.

1. Design the test structure to be more area intensive, thus making this parasitic component to be negligible within desired accuracy of measurement.

2. Supplementary test structures can be designed with different edge dimensions such that this parasitic fringing component of capacitance can be modeled, and subtracted out later from target test structure.

Although the embodiments have been particularly described with reference to embodiments thereof, it should be readily apparent to those of ordinary skill in the art that various changes, modifications and substitutes are intended within the form and details thereof, without departing from the spirit and scope thereof. Accordingly, it will be appreciated that in numerous instances some features will be employed without a corresponding use of other features. Further, those skilled in the art will understand that variations can be made in the number and arrangement of components illustrated in the above figures.

What is claimed is:

1. An apparatus for determining a thickness of a fully depleted silicon-on-insulator layer disposed in a CMOS integrated circuit, the apparatus being disposed on a FDSOI substrate that also includes the CMOS integrated circuit, the apparatus comprising:

a test structure that includes at least one test circuit, the at least one test circuit including an isolated fully depleted silicon-on-insulator layer disposed above an isolated buried oxide layer and a gate dielectric disposed above the isolated fully depleted silicon-on-insulator layer and which further includes a first Epi region surrounding the isolated fully depleted silicon-on-insulator layer to bias the isolated fully depleted silicon-on-insulator layer, the test structure further including:

a total capacitance measurement circuit configured to output a total capacitance measurement, the total capacitance measurement circuit including a first terminal connected to the gate dielectric disposed above the isolated fully depleted silicon-on-insulator layer and a second terminal connected to one of an n-well and a p-well, for obtaining the total capacitance measurement;

a gate dielectric capacitance measurement circuit configured to output a gate dielectric capacitance measurement, the gate dielectric capacitance measurement circuit including the first terminal connected to the gate dielectric and a third terminal connected to source/drain regions disposed adjacent the isolated fully depleted silicon-on-insulator layer and the second terminal connected to one of an n-well and p-well, for obtaining the gate dielectric capacitance measurement; and a buried oxide capacitance measurement circuit configured to output a buried oxide capacitance measurement, the buried oxide capacitance measurement circuit including the first terminal connected to the gate dielectric and the second terminal connected to one of an n-well and p-well, for obtaining the buried oxide capacitance measurement.

2. The apparatus according to claim 1, wherein the at least one test circuit includes a plurality of test circuits, wherein each of the plurality of test circuits include the isolated fully depleted silicon-on-insulator layer disposed above the isolated buried oxide layer, wherein a desired thickness of the isolated fully depleted silicon-on-insulator layer and a desired thickness of the isolated buried oxide layer on the plurality of test circuits is representative of, respectively, a thickness of the isolated fully depleted silicon-on-insulator layer and a thickness of the isolated buried oxide layer on the CMOS integrated circuit, the test structure further including:

the total capacitance measurement circuit as one of the plurality of test circuits;

the gate dielectric capacitance measurement circuit as another of the plurality of test circuits; and the buried oxide capacitance measurement circuit as a further one of the plurality of test circuits.

3. The apparatus according to claim 2 wherein the plurality of test circuits each further include a ground plane disposed between the buried oxide and one of an n-well and a p-well.

4. The apparatus according to claim 2 wherein at least some of the plurality of test circuits are a same size.

5. The apparatus according to claim 2, wherein at least some of the plurality of test circuits are a different size.

6. The apparatus according to claim 2, wherein the plurality of test circuits are each disposed in close proximity to each other on a scribe lane of the FDSOI substrate.

7. The apparatus according to claim 2, wherein the plurality of test circuits includes at least two sets of the plurality of test circuits disposed in disparate locations of the FDSOI substrate.

8. The apparatus according to claim 7, wherein the plurality of test circuits within each set of the plurality of test circuits are each disposed in close proximity to each other and within a single scribe lane of the FDSOI substrate.

* * * * *